US011129312B2

(12) United States Patent
Grinsteinner (10) Patent No.: US 11,129,312 B2
(45) Date of Patent: Sep. 21, 2021

(54) ELECTRONIC MODULE FOR USE IN AN AUTOMOTIVE VEHICLE

(71) Applicant: Ticona LLC, Florence, KY (US)

(72) Inventor: Darin Grinsteinner, Fort Mithcell, KY (US)

(73) Assignee: Ticona LLC, Florence, KY (US)

( * ) Notice: Subject to any disclaimer, the term of this patent is extended or adjusted under 35 U.S.C. 154(b) by 261 days.

(21) Appl. No.: 16/190,579

(22) Filed: Nov. 14, 2018

(65) Prior Publication Data

US 2019/0159371 A1  May 23, 2019

Related U.S. Application Data

(60) Provisional application No. 62/588,544, filed on Nov. 20, 2017.

(51) Int. Cl.
*H05K 9/00* (2006.01)
*H05K 7/20* (2006.01)
(Continued)

(52) U.S. Cl.
CPC ............ *H05K 9/0047* (2013.01); *G01S 7/023* (2013.01); *G01S 7/032* (2013.01); *G01S 7/4813* (2013.01);
(Continued)

(58) Field of Classification Search
CPC .. H05K 9/0047; H05K 9/0086; H05K 9/0083; H05K 9/009; H05K 3/03; H05K 5/0047; G01S 7/023; G01S 7/4813; G01S 13/931; G01S 7/23; G01S 7/354; G01S 7/003; G01S 13/584; G01S 13/42; G01S 13/34; G01S 2007/356; H01Q 17/002; H01Q 1/526; C08K 7/04; H04B 1/22;
(Continued)

(56) References Cited

U.S. PATENT DOCUMENTS 4,234,648 A  11/1980 Patz et al.
4,500,595 A  2/1985 Gerteisen et al.
(Continued)

FOREIGN PATENT DOCUMENTS

CN  101161726 A  4/2008
CN  101469109     7/2009
(Continued)

OTHER PUBLICATIONS

Carbon Fibers, *Wikipedia*, Feb. 25, 2019, 8 pages https://en/wikipedia.org/w/index.php?title=Carbon_fibers&oldid=810801038.
(Continued)

*Primary Examiner* — Erin F Heard
*Assistant Examiner* — Michael W Justice
(74) *Attorney, Agent, or Firm* — Dority & Manning, P.A.

(57) ABSTRACT

An electronic module that comprises a housing; a cover that is disposed over the housing to define an interior; and one or more electronic components positioned within the interior is provided. At least a portion of the housing, cover, or both contain a polymer composition that exhibits an in-plane thermal conductivity of about 1 W/m-K or more as determined in accordance with ASTM E 1461-13 and an electromagnetic shielding effectiveness of about 20 dB or more as determined at a frequency of 1 GHz in accordance with EM 2107A.

26 Claims, 3 Drawing Sheets

(51) Int. Cl.

| | | |
|---|---|---|
| G01S 13/931 | (2020.01) | |
| G01S 7/03 | (2006.01) | |
| G01S 7/481 | (2006.01) | |
| G01S 7/02 | (2006.01) | |
| H01Q 17/00 | (2006.01) | |
| H05K 5/03 | (2006.01) | |
| H01B 1/22 | (2006.01) | |
| H01Q 1/52 | (2006.01) | |
| H01Q 21/00 | (2006.01) | |
| H01Q 21/06 | (2006.01) | |

(52) U.S. Cl.
CPC ......... *G01S 13/931* (2013.01); *H01Q 17/002* (2013.01); *H05K 5/03* (2013.01); *H05K 7/20854* (2013.01); *H05K 9/006* (2013.01); *H05K 9/009* (2013.01); *H05K 9/0058* (2013.01); *H05K 9/0083* (2013.01); *G01S 7/027* (2021.05); *G01S 2013/9323* (2020.01); *H01B 1/22* (2013.01); *H01Q 1/526* (2013.01); *H01Q 17/004* (2013.01); *H01Q 21/0087* (2013.01); *H01Q 21/065* (2013.01); *Y10T 428/24994* (2015.04); *Y10T 428/25* (2015.01)

(58) Field of Classification Search
CPC ... H04B 1/24; H04B 15/02; Y10T 428/24994; Y10T 428/25; C01S 2007/027; H04L 27/103
USPC .............. 342/1; 428/297.4, 323, 462, 327; 252/500, 62.5; 419/24, 10; 526/348.7
See application file for complete search history.

(56) References Cited

U.S. PATENT DOCUMENTS

| | | |
|---|---|---|
| 4,596,670 A | 6/1986 | Liu |
| RE32,777 E | 10/1988 | Hawley |
| 4,816,184 A | 3/1989 | Fukuda et al. |
| 4,952,448 A | 8/1990 | Bullock et al. |
| 4,973,514 A | 11/1990 | Gamble et al. |
| 5,089,326 A | 2/1992 | Bonazza |
| 5,397,608 A | 3/1995 | Soens |
| 5,736,603 A | 4/1998 | Pfeiffer et al. |
| 6,399,737 B1 | 6/2002 | Elkovitch |
| 6,503,964 B2 | 1/2003 | Smith et al. |
| 7,078,098 B1 | 7/2006 | Woodside et al. |
| 7,208,192 B2 * | 4/2007 | Bunyan ............... H01L 23/3737 156/307.3 |
| 7,608,326 B2 | 10/2009 | Johnson |
| 7,842,381 B2 | 11/2010 | Johnson |
| 8,119,191 B2 * | 2/2012 | Bunyan ................ H05K 9/0083 427/96.3 |
| 8,324,307 B2 | 12/2012 | Harder et al. |
| 8,547,710 B2 | 10/2013 | Ruehl et al. |
| 8,552,101 B2 | 10/2013 | l'Abee et al. |
| 9,233,486 B2 | 1/2016 | Regan et al. |
| 9,278,472 B2 | 3/2016 | Eastep et al. |
| 9,392,730 B2 | 7/2016 | Hartmann et al. |
| 9,543,552 B2 | 1/2017 | Haspel et al. |
| 2003/0222249 A1 * | 12/2003 | Bunyan ................ H01L 23/552 252/500 |
| 2007/0230131 A1 * | 10/2007 | Bunyan ................ H05K 9/0083 361/704 |
| 2008/0121848 A1 | 5/2008 | Nobbs |
| 2010/0116431 A1 | 5/2010 | Pawlenko et al. |
| 2015/0069290 A1 * | 3/2015 | Guo ........................ C08K 3/22 252/75 |
| 2015/0259589 A1 | 9/2015 | Takagi et al. |
| 2016/0218335 A1 | 7/2016 | Baek |
| 2016/0223663 A1 * | 8/2016 | Schmalenberg ...... G01S 17/931 |
| 2017/0185108 A1 * | 6/2017 | Sasaki ...................... B32B 5/12 |
| 2019/0153179 A1 | 5/2019 | Grinsteinner |

FOREIGN PATENT DOCUMENTS

| | | |
|---|---|---|
| CN | 105199379 | * 12/2015 |
| EP | 3 369 779 A1 | 9/2018 |
| JP | S 6312663 A | 1/1988 |
| JP | 2004027097 A | 1/2004 |
| KR | 100849496 B1 | 7/2008 |
| KR | 20160067335 A | 6/2016 |

OTHER PUBLICATIONS

International Search Report and Written Opinion for PCT/US2018/060943 dated Jan. 24, 2019, 8 pages.
Supplementary European Search Report for EP 18 87 9482 dated Jul. 27, 2021, 8 pages.

* cited by examiner

ELECTRONIC MODULE FOR USE IN AN AUTOMOTIVE VEHICLE

RELATED APPLICATION

The present application claims priority to U.S. Application Ser. No. 62/588,544 (filed on Nov. 20, 2017), which is incorporated herein in its entirety by reference thereto.

BACKGROUND OF THE INVENTION

Electronic modules, such as radar modules, lidar modules, camera modules, etc., are routinely employed in automotive vehicles (e.g., electric vehicles). A radar module, for instance, typically contains one or more printed circuit boards having electrical components dedicated to handling radio frequency (RF) radar signals, digital signal processing tasks, etc. To ensure that these components operate effectively, they are generally received in a housing structure and then covered with a radome that is transparent to radio waves. Because other surrounding electrical devices can generate electromagnetic interference ("EMI") that can impact the accurate operation of the radar module, an EMI shield (e.g., aluminum plate) is generally positioned between the housing and printed circuit board. In addition to protecting the components from electromagnetic interference, it is also generally necessary to employ a heat sink (e.g., thermal pad) on the circuit board to help draw heat away from the components. Unfortunately, the addition of such components can add a substantial amount of cost and weight to the resulting module, which is particularly disadvantageous as the automotive industry is continuing to require smaller and lighter components. As such, a need currently exists for an electronic module that does not require the need for additional EMI shields and/or heat sinks.

SUMMARY OF THE INVENTION

In accordance with one embodiment of the present invention, an electronic module is disclosed that comprises a housing; a cover that is disposed over the housing to define an interior; and one or more electronic components positioned within the interior. At least a portion of the housing, cover, or both contain a polymer composition that exhibits an in-plane thermal conductivity of about 1 W/m-K or more as determined in accordance with ASTM E 1461-13 and an electromagnetic shielding effectiveness of about 20 dB or more as determined at a frequency of 1 GHz in accordance with EM 2107A.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

Repeat use of reference characters in the present specification and drawings is intended to represent the same or analogous features or elements of the present invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention.

Generally speaking, the present invention is directed to an electronic module for use in an automotive vehicle (e.g., electric vehicle). The module contains a housing that receives one or more electronic components (e.g., printed circuit board, antenna assemblies, radio frequency devices, sensors, light sensing and/or transmitting elements (e.g., fibers optics), cameras, global positioning devices, etc.). The housing may, for instance, include a base that contains a sidewall extending therefrom. A cover may also be supported on the sidewall of the base to define an interior within which the electronic component(s) are received and protected from the exterior environment. If desired, the cover may also define a window so that certain types of electronic components (e.g., light detectors) can communicate with the exterior environment.

Regardless of the particular configuration of the module, a polymer composition is used to form all or a portion of the housing and/or cover that exhibits a unique combination of thermal conductivity and EMI shielding effectiveness. The polymer composition, for instance, may exhibit an in-plane thermal conductivity of about 1 W/m-K or more, in some embodiments about 3 W/m-K or more, in some embodiments about 5 W/m-K or more, and in some embodiments, from about 7 to about 15 W/m-K, as determined in accordance with ASTM E 1461-13. The composition may also exhibit a through-plane thermal conductivity of about 0.3 W/m-K or more, in some embodiments about 0.5 W/m-K or more, in some embodiments about 0.40 W/m-K or more, and in some embodiments, from about 1 to about 5 W/m-K, as determined in accordance with ASTM E 1461-13. In addition to being thermally conductive, the composition can also provide a high degree of shielding effectiveness to electromagnetic interference ("EMI"). More particularly, the EMI shielding effectiveness may be about 20 decibels (dB) or more, in some embodiments about 30 dB or more, and in some embodiments, from about 40 dB to about 100 dB, as determined in accordance with ASTM D4935-10 at frequencies ranging from about 100 Mz to about 2 GHz (e.g., 1 GHz). Despite having good EMI shielding effectiveness, the composition may nevertheless still exhibit a relatively low volume resistivity as determined in accordance with ISO 3915:1981 and/or ISO 1853:2011, such as about 10 ohm-cm or less, in some embodiments from about 5 ohm-cm or less, and in some embodiments, from about 0.4 to about 2 ohm-cm.

In one embodiment, for instance, the polymer composition may be used to form the cover. In such embodiments, the housing may be formed from the polymer composition of the present invention or from a different material. Notably, one benefit of the present invention is that conventional EMI metal shields (e.g., aluminum plates) and/or heat sinks can be eliminated from the module design, thereby reducing the weight and overall cost of the module. As indicated above, the electronic modules may serve a variety of different uses depending on the particular type of electronic components employed. When used in automotive applications, for instance, the electronic module may be used to sense the positioning of the vehicle relative to one or more three-dimensional objects. In this regard, the module may contain radio frequency sensing components, light detection or optical components, cameras, etc., as well as combinations thereof. For example, the module may be a radio detection and ranging ("radar") module, light detection and ranging ("lidar") module, camera module, global positioning module, etc., or it may be an integrated module that combines two or more of these components.

Figure 3:
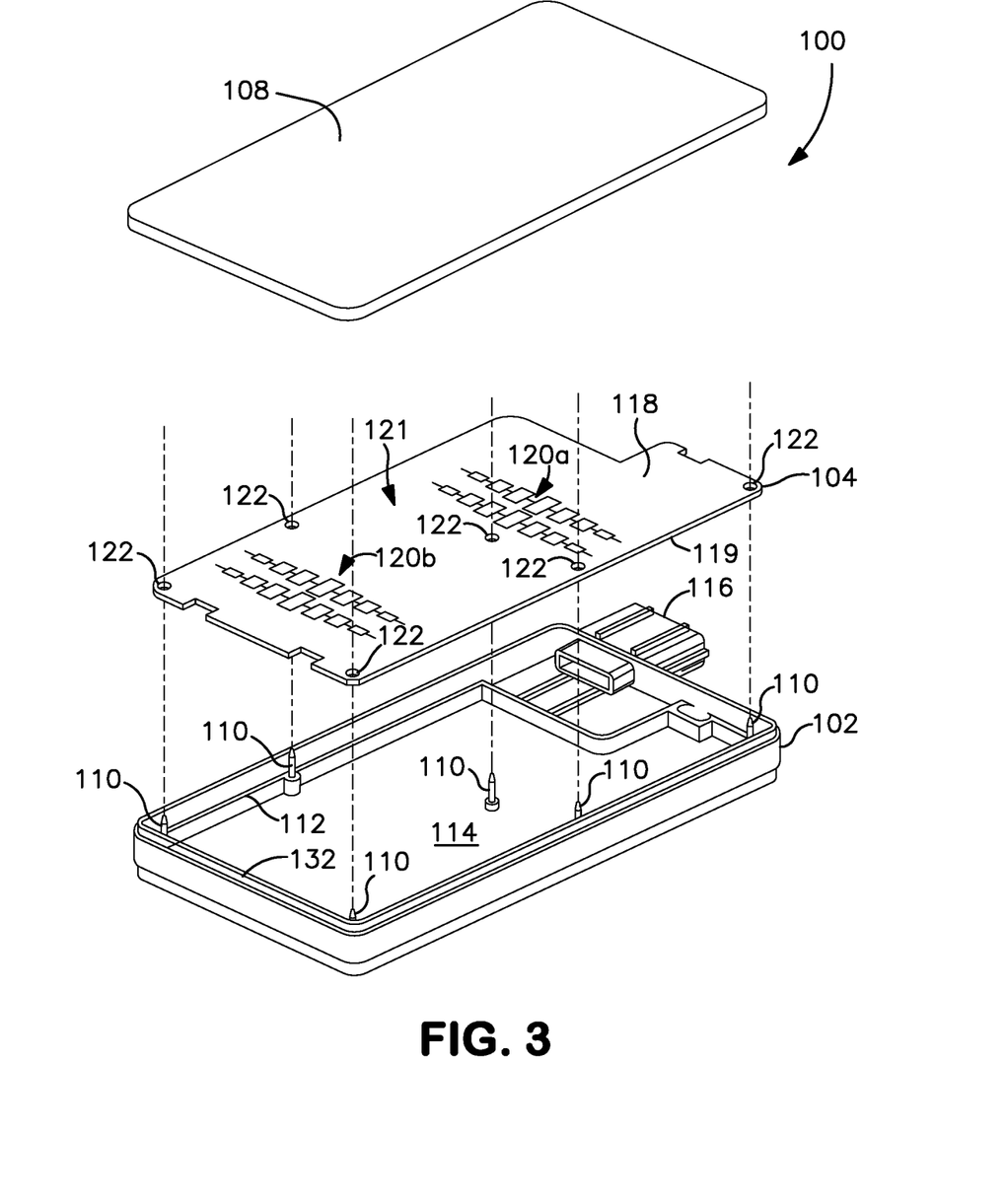
FIG. 3 is an exploded perspective view of one embodiment of the electronic module of the present invention.

Referring to FIG. 3, for instance, one particular embodiment of a radar module 100 is shown that may incorporate the polymer composition of the present invention. The radar module 100 includes a housing 102 that contains sidewalls 132 extending from a base 114. If desired, the housing 102 may also contain a shroud 116 that can accommodate an electrical connector (not shown). Regardless, a printed circuit board ("PCB") is received within the interior of the module 100 and attached to housing 102. More particularly, the circuit board 104 contains holes 122 that are aligned with and receive posts 110 located on the housing 102. The circuit board 104 has a first surface 118 on which electrical circuitry 121 is provided to enable radio frequency operation of the module 100. For example, the RF circuitry 121 can include one or more antenna patterns 120a and 120b. The circuit board 104 also has a second surface 119 that opposes the first surface 118 and may optionally contain other electrical components, such as components that enable the digital electronic operation of the module 100 (e.g., digital signal processors, semiconductor memories, input/output interface devices, etc.). Alternatively, such components may be provided on an additional printed circuit board. A cover 108 (or radome) may also be employed that is disposed over the circuit board 104 and attached to the housing 102 (e.g., sidewall) through known techniques, such as by welding, adhesives, etc., to seal the electrical components within the interior. As indicated above, the polymer composition may be used to form all or a portion of the cover 108 and/or the housing 102. Because it possesses the unique combination of EMI shielding effectiveness and thermal conductivity, conventional EMI shields (e.g., aluminum plates) and/or heat sinks may be eliminated. Of course, other types of electronic modules may also employ the polymer composition of the present invention. For example, a lidar module may be formed that contains a fiber optic assembly for receiving and transmitting light pulses that is received within the interior of a housing/cover assembly in a manner similar to the embodiments discussed above.

The polymer composition employed in the electronic module typically contains an electromagnetic interference shielding ("EMI") filler and a thermally conductive filler distributed within a polymer matrix. The polymer matrix typically constitutes from about 30 wt. % to about 80 wt. %, in some embodiments from about 35 wt. % to about 80 wt. %, and in some embodiments, from about 40 wt. % to about 70 wt. % of the composition. Any of a variety of polymers or combinations of polymers may generally be employed in the polymer matrix. Suitable polymers may include, for instance, polyolefins (e.g., ethylene polymers, propylene polymers, etc.), polyamides (e.g., aliphatic, semi-aromatic, or aromatic polyam ides), polyesters, polyarylene sulfides, polyetherimides, polyacetals (e.g., polyoxymethylene), polyphenylene oxides, polyarylketones (e.g., polyetheretherketone polyetherketoneketone, etc.), polycarbonates, etc., as well as blends thereof.

Aromatic polymers are particularly suitable as such polymers are generally considered "high performance" polymers that they have a relatively high glass transition temperature and/or high melting temperature. Such high performance aromatic polymers can thus provide a substantial degree of heat resistance to the resulting polymer composition. For example, suitable aromatic polymers may have a glass transition temperature of about 40° C. or more, in some embodiments about 50° C. or more, and in some embodiments, from about 60° C. to about 320° C. The aromatic polymers may also have a melting temperature of about 200° C. or more, in some embodiments from about 210° C. to about 400° C., and in some embodiments, from about 220° C. to about 380° C. The glass transition and melting temperatures may be determined as is well known in the art using differential scanning calorimetry ("DSC"), such as determined by ISO Test No. 11357-2:2013 (glass transition) and 11357-3:2011 (melting).

The aromatic polymer can be substantially amorphous, semi-crystalline, or crystalline in nature. One example of a suitable semi-crystalline aromatic polymer, for instance, is an aromatic polyester that is a condensation product of an aromatic dicarboxylic acid having 8 to 14 carbon atoms and at least one diol, such as neopentyl glycol, cyclohexanedimethanol, 2,2-dimethyl-1,3-propane diol and aliphatic glycols of the formula $HO(CH_2)_nOH$ where n is an integer of 2 to 10. Examples of such aromatic polyesters may include, for instance, poly(ethylene terephthalate) (PET), poly(1,4-butylene terephthalate) (PBT), poly(1,3-propylene terephthalate) (PPT), poly(1,4-butylene 2,6-naphthalate) (PBN), poly(ethylene 2,6-naphthalate) (PEN), poly(1,4-cyclohexylene dimethylene terephthalate) (PCT), and copolymers and mixtures of the foregoing.

Another suitable semi-crystalline aromatic polymers is an aromatic polyamide. Particularly suitable aromatic polyamides are those having a relatively high melting temperature, such as about 200° C. or more, in some embodiments about 220° C. or more, and in some embodiments, from about 240° C. to about 320° C., as determined using differential scanning calorimetry according to ISO Test No. 11357. The glass transition temperature of aromatic polyamides is likewise generally from about 110° C. to about 160° C. Aromatic polyam ides typically contain repeating units held together by amide linkages (NH—CO) and are synthesized through the polycondensation of dicarboxylic acids (e.g., aromatic dicarboxylic acids), diamines (e.g., aliphatic diamines), etc. For example, the aromatic polyamide may contain aromatic repeating units derived from an aromatic dicarboxylic acid, such as terephthalic acid, isophthalic acid, 2,6-naphthalenedicarboxylic acid, 2,7-naphthalenedicarboxylic acid, 1,4-naphthalenedicarboxylic acid, 1,4-phenylenedioxy-diacetic acid, 1,3-phenylenedioxy-diacetic acid, diphenic acid, 4,4'-oxydibenzoic acid, diphenylmethane-4,4'-dicarboxylic acid, diphenylsulfone-4,4'-dicarboxylic acid, 4,4'-biphenyldicarboxylic acid, etc., as well as combinations thereof. Terephthalic acid is particularly suitable. Of course, it should also be understood that other types of acid units may also be employed, such as aliphatic dicarboxylic acid units, polyfunctional carboxylic acid units, etc. The aromatic polyamide may also contain aliphatic repeating units derived from an aliphatic diamine, which typically has from 4 to 14 carbon atoms. Examples of such diamines include linear aliphatic alkylenediamines, such as 1,4-tetramethylenediamine, 1,6-hexanediamine, 1,7-heptanediamine, 1,8-octanediamine, 1,9-nonanediamine, 1,10-decanediamine, 1,11-undecanediamine, 1,12-dodecanediamine, etc.; branched aliphatic alkylenediamines, such as 2-methyl-1,5-pentanediamine, 3-methyl-1,5 pentanediamine, 2,2,4-trimethyl-1,6-hexanediamine, 2,4,4-trimethyl-

1,6-hexanediamine, 2,4-dimethyl-1,6-hexanediamine, 2-methyl-1,8-octanediamine, 5-methyl-1,9-nonanediamine, etc.; as well as combinations thereof. Repeating units derived from 1,9-nonanediamine and/or 2-methyl-1,8-octanediamine are particularly suitable. Of course, other diamine units may also be employed, such as alicyclic diamines, aromatic diamines, etc.

Particularly suitable polyamides may include poly(nonamethylene terephthalamide) (PA9T), poly(nonamethylene terephthalamide/nonamethylene decanediamide) (PA9T/910), poly(nonamethylene terephthalamide/nonamethylene dodecanediamide) (PA9T/912), poly(nonamethylene terephthalam ide/11-am inoundecanamide) (PA9T/11), poly(nonamethylene terephthalam ide/12-am inododecanamide) (PA9T/12), poly(decamethylene terephthalamide/11-aminoundecanamide) (PA 10T/11), poly(decamethylene terephthalamide/12-aminododecanamide) (PA10T/12), poly(decamethylene terephthalamide/decamethylene decanediamide) (PA10T/1010), poly(decamethylene terephthalamide/decamethylene dodecanediam ide) (PA10T/1012), poly(decamethylene terephlhalamide/tetramethylene hexanediamide) (PA10T/46), poly(decamethylene terephthalamide/caprolactam) (PA10T/6), poly(decamethylene terephthalamide/hexamethylene hexanediamide) (PA10T/66), poly(dodecamethylene Ierephthalamide/dodecamelhylene dodecanediarnide) (PA12T/1212), poly(dodecamethylene terephthalamide/caprolactam) (PA12T/6), poly(dodecamethylene terephthalamide/hexamethylene hexanediamide) (PA12T/66), and so forth. Yet other examples of suitable aromatic polyamides are described in U.S. Pat. No. 8,324,307 to Harder, et al.

Polyarylene sulfides are also suitable semi-crystalline aromatic polymers. The polyarylene sulfide may be homopolymers or copolymers. For instance, selective combination of dihaloaromatic compounds can result in a polyarylene sulfide copolymer containing not less than two different units. For instance, when p-dichlorobenzene is used in combination with m-dichlorobenzene or 4,4'-dichlorodiphenylsulfone, a polyarylene sulfide copolymer can be formed containing segments having the structure of formula:

and segments having the structure of formula:

or segments having the structure of formula:

The polyarylene sulfide may be linear, semi-linear, branched or crosslinked. Linear polyarylene sulfides typically contain 80 mol % or more of the repeating unit —(Ar—S)—. Such linear polymers may also include a small amount of a branching unit or a cross-linking unit, but the amount of branching or cross-linking units is typically less than about 1 mol % of the total monomer units of the polyarylene sulfide. A linear polyarylene sulfide polymer may be a random copolymer or a block copolymer containing the above-mentioned repeating unit. Semi-linear polyarylene sulfides may likewise have a cross-linking structure or a branched structure introduced into the polymer a small amount of one or more monomers having three or more reactive functional groups. By way of example, monomer components used in forming a semi-linear polyarylene sulfide can include an amount of polyhaloaromatic compounds having two or more halogen substituents per molecule which can be utilized in preparing branched polymers. Such monomers can be represented by the formula $R'X_n$, where each X is selected from chlorine, bromine, and iodine, n is an integer of 3 to 6, and R' is a polyvalent aromatic radical of valence n which can have up to about 4 methyl substituents, the total number of carbon atoms in R' being within the range of 6 to about 16. Examples of some polyhaloaromatic compounds having more than two halogens substituted per molecule that can be employed in forming a semi-linear polyarylene sulfide include 1,2,3-trichlorobenzene, 1,2,4-trichlorobenzene, 1,3-dichloro-5-bromobenzene, 1,2,4-triiodobenzene, 1,2,3,5-tetrabromobenzene, hexachlorobenzene, 1,3,5-trichloro-2,4,6-trimethylbenzene, 2,2',4,4'-tetrachlorobiphenyl, 2,2',5,5'-tetra-iodobiphenyl, 2,2',6,6'-tetrabromo-3,3',5,5'-tetramethylbiphenyl, 1,2,3,4-tetrachloronaphthalene, 1,2,4-tribromo-6-methylnaphthalene, etc., and mixtures thereof.

Another suitable semi-crystalline aromatic polymer that may be employed in the present invention is a polyaryletherketone. Polyaryletherketones are semi-crystalline polymers with a relatively high melting temperature, such as from about 300° C. to about 400° C., in some embodiments from about 310° C. to about 390° C., and in some embodiments, from about 330° C. to about 380° C. The glass transition temperature may likewise be from about 110° C. to about 200° C. Particularly suitable polyaryletherketones are those that primarily include phenyl moieties in conjunction with ketone and/or ether moieties. Examples of such polymers include polyetheretherketone ("PEEK"), polyetherketone ("PEK"), polyetherketoneketone ("PEKK"), polyetherketoneetherketoneketone ("PEKEKK"), polyetheretherketoneketone ("PEEKK"), polyether-diphenyl-ether-ether-diphenyl-ether-phenyl-ketone-phenyl, etc., as well as blends and copolymers thereof.

As indicated above, substantially amorphous polymers may also be employed that lack a distinct melting point temperature. Suitable amorphous polymers may include, for instance, polyphenylene oxide ("PPO"), aromatic polycarbonates, aromatic polyetherim ides, etc. Aromatic polycarbonates, for instance, typically have a glass transition temperature of from about 130° C. to about 160° C. and contain aromatic repeating units derived from one or more aromatic diols. Particularly suitable aromatic diols are bisphenols, such as gem-bisphenols in which two phenols groups are attached to a single carbon atom of a bivalent connecting radical. Examples of such bisphenols may include, for instance, such as 4,4'-isopropylidenediphenol ("bisphenol A"), 4,4'-ethylidenediphenol, 4,4'-(4-chloro-a-methylbenzylidene)diphenol, 4,4'cyclohexylidenediphenol, 4,4 (cyclohexylmethylene)diphenol, etc., as well as combinations thereof. The aromatic diol may be reacted with a phosgene. For example, the phosgene may be a carbonyl chloride having the formula $C(O)Cl_2$. An alternative route to the synthesis of an aromatic polycarbonate may involve the transesterification of the aromatic diol (e.g., bisphenol) with a diphenyl carbonate.

In addition to the polymers referenced above, highly crystalline aromatic polymers may also be employed in the polymer composition. Particularly suitable examples of such polymers are liquid crystalline polymers, which have a high degree of crystallinity that enables them to effectively fill the small spaces of a mold. Liquid crystalline polymers are generally classified as "thermotropic" to the extent that they can possess a rod-like structure and exhibit a crystalline behavior in their molten state (e.g., thermotropic nematic state). The polymers have a relatively high melting temperature, such as from about 250° C. to about 400° C., in some embodiments from about 280° C. to about 390° C., and in some embodiments, from about 300° C. to about 380° C. Such polymers may be formed from one or more types of repeating units as is known in the art. A liquid crystalline polymer may, for example, contain one or more aromatic ester repeating units, typically in an amount of from about 60 mol. % to about 99.9 mol. %, in some embodiments from about 70 mol. % to about 99.5 mol. %, and in some embodiments, from about 80 mol. % to about 99 mol. % of the polymer. The aromatic ester repeating units may be generally represented by the following Formula (I): wherein, (I)

ring B is a substituted or unsubstituted 6-membered aryl group (e.g., 1,4-phenylene or 1,3-phenylene), a substituted or unsubstituted 6-membered aryl group fused to a substituted or unsubstituted 5- or 6-membered aryl group (e.g., 2,6-naphthalene), or a substituted or unsubstituted 6-membered aryl group linked to a substituted or unsubstituted 5- or 6-membered aryl group (e.g., 4,4-biphenylene); and $Y_1$ and $Y_2$ are independently O, C(O), NH, C(O)HN, or NHC(O).

Typically, at least one of $Y_1$ and $Y_2$ are C(O). Examples of such aromatic ester repeating units may include, for instance, aromatic dicarboxylic repeating units ($Y_1$ and $Y_2$ in Formula I are C(O)), aromatic hydroxycarboxylic repeating units ($Y_1$ is O and $Y_2$ is C(O) in Formula I), as well as various combinations thereof.

Aromatic dicarboxylic repeating units, for instance, may be employed that are derived from aromatic dicarboxylic acids, such as terephthalic acid, isophthalic acid, 2,6-naphthalenedicarboxylic acid, diphenyl ether-4,4'-dicarboxylic acid, 1,6-naphthalenedicarboxylic acid, 2,7-naphthalenedicarboxylic acid, 4,4'-dicarboxybiphenyl, bis(4-carboxyphenyl)ether, bis(4-carboxyphenyl)butane, bis(4-carboxyphenyl)ethane, bis(3-carboxyphenyl)ether, bis(3-carboxyphenyl)ethane, etc., as well as alkyl, alkoxy, aryl and halogen substituents thereof, and combinations thereof. Particularly suitable aromatic dicarboxylic acids may include, for instance, terephthalic acid ("TA"), isophthalic acid ("IA"), and 2,6-naphthalenedicarboxylic acid ("NDA"). When employed, repeating units derived from aromatic dicarboxylic acids (e.g., IA, TA, and/or NDA) typically constitute from about 5 mol. % to about 60 mol. %, in some embodiments from about 10 mol. % to about 55 mol. %, and in some embodiments, from about 15 mol. % to about 50% of the polymer.

Aromatic hydroxycarboxylic repeating units may also be employed that are derived from aromatic hydroxycarboxylic acids, such as, 4-hydroxybenzoic acid; 4-hydroxy-4'-biphenylcarboxylic acid; 2-hydroxy-6-naphthoic acid; 2-hydroxy-5-naphthoic acid; 3-hydroxy-2-naphthoic acid; 2-hydroxy-3-naphthoic acid; 4'-hydroxyphenyl-4-benzoic acid; 3'-hydroxyphenyl-4-benzoic acid; 4'-hydroxyphenyl-3-benzoic acid, etc., as well as alkyl, alkoxy, aryl and halogen substituents thereof, and combination thereof. Particularly suitable aromatic hydroxycarboxylic acids are 4-hydroxybenzoic acid ("NBA") and 6-hydroxy-2-naphthoic acid ("HNA"). When employed, repeating units derived from hydroxycarboxylic acids (e.g., HBA and/or HNA) typically constitute from about 10 mol. % to about 85 mol. %, in some embodiments from about 20 mol. % to about 80 mol. %, and in some embodiments, from about 25 mol. % to about 75% of the polymer.

Other repeating units may also be employed in the polymer. In certain embodiments, for instance, repeating units may be employed that are derived from aromatic diols, such as hydroquinone, resorcinol, 2,6-dihydroxynaphthalene, 2,7-dihydroxynaphthalene, 1,6-dihydroxynaphthalene, 4,4'-dihydroxybiphenyl (or 4,4'-biphenol), 3,3'-dihydroxybiphenyl, 3,4'-dihydroxybiphenyl, 4,4'-dihydroxybiphenyl ether, bis(4-hydroxyphenyl)ethane, etc., as well as alkyl, alkoxy, aryl and halogen substituents thereof, and combinations thereof. Particularly suitable aromatic diols may include, for instance, hydroquinone ("HQ") and 4,4'-biphenol ("BP"). When employed, repeating units derived from aromatic diols (e.g., HQ and/or BP) typically constitute from about 1 mol. % to about 30 mol. %, in some embodiments from about 2 mol. % to about 25 mol. %, and in some embodiments, from about 5 mol. % to about 20% of the polymer. Repeating units may also be employed, such as those derived from aromatic amides (e.g., acetaminophen ("APAP")) and/or aromatic amines (e.g., 4-aminophenol ("AP"), 3-aminophenol, 1,4-phenylenediamine, 1,3-phenylenediamine, etc.). When employed, repeating units derived from aromatic amides (e.g., APAP) and/or aromatic amines (e.g., AP) typically constitute from about 0.1 mol. % to about 20 mol. %, in some embodiments from about 0.5 mol. % to about 15 mol. %, and in some embodiments, from about 1 mol. % to about 10% of the polymer. It should also be understood that various other monomeric repeating units may be incorporated into the polymer. For instance, in certain embodiments, the polymer may contain one or more repeating units derived from non-aromatic monomers, such as aliphatic or cycloaliphatic hydroxycarboxylic acids, dicarboxylic acids, diols, amides, amines, etc. Of course, in other embodiments, the polymer may be "wholly aromatic" in that it lacks repeating units derived from non-aromatic (e.g., aliphatic or cycloaliphatic) monomers.

In one particular embodiment, the liquid crystalline polymer may be formed from repeating units derived from 4-hydroxybenzoic acid ("NBA") and terephthalic acid ("TA") and/or isophthalic acid ("IA"), as well as various other optional constituents. The repeating units derived from 4-hydroxybenzoic acid ("NBA") may constitute from about 10 mol. % to about 80 mol. %, in some embodiments from about 30 mol. % to about 75 mol. %, and in some embodiments, from about 45 mol. % to about 70% of the polymer. The repeating units derived from terephthalic acid ("TA") and/or isophthalic acid ("IA") may likewise constitute from about 5 mol. % to about 40 mol. %, in some embodiments from about 10 mol. % to about 35 mol. %, and in some embodiments, from about 15 mol. % to about 35% of the polymer. Repeating units may also be employed that are derived from 4,4'-biphenol ("BP") and/or hydroquinone ("HQ") in an amount from about 1 mol. % to about 30 mol. %, in some embodiments from about 2 mol. % to about 25 mol. %, and in some embodiments, from about 5 mol. % to about 20% of the polymer. Other possible repeating units may include those derived from 6-hydroxy-2-naphthoic acid ("HNA"), 2,6-naphthalenedicarboxylic acid ("NDA"), and/or acetaminophen ("APAP"). In certain embodiments, for example, repeating units derived from HNA, NDA, and/or APAP may each constitute from about 1 mol. % to about 35 mol. %, in some embodiments from about 2 mol. % to about 30 mol. %, and in some embodiments, from about 3 mol. % to about 25 mol. % when employed.

As indicated above, a thermally conductive filler may be distributed within the polymer matrix, typically in an amount from about 5 wt. % to about 40 wt. %, in some embodiments from about 10 wt. % to about 35 wt. %, and in some embodiments, from about 15 wt. % to about 30 wt. % of the composition. The thermally conductive filler may have a high intrinsic thermal conductivity, such as about 50 W/m-K or more, in some embodiments about 100 W/m-K or more, and in some embodiments, about 150 W/m-K or more. Examples of such materials may include, for instance, boron nitride (BN), aluminum nitride (AlN), magnesium silicon nitride ($MgSiN_2$), graphite (e.g., expanded graphite), silicon carbide (SiC), carbon nanotubes, carbon black, metal oxides (e.g., zinc oxide, magnesium oxide, beryllium oxide, zirconium oxide, yttrium oxide, etc.), metallic powders (e.g., aluminum, copper, bronze, brass, etc.), etc., as well as combinations thereof. Graphite is particularly suitable for use in the composition of the present invention. In fact, in certain embodiments, graphite may constitute a majority of the thermally conductive filler employed in the polymer composition, such as about 50 wt. % or more, in some embodiments, about 70 wt. % or more, and in some embodiments, from about 90 wt. % to 100 wt. % (e.g., 100 wt. %) of the thermally conductive filler.

The thermally conductive filler may be provided in various forms, such as particulate materials, fibers, etc. For instance, particulate materials may be employed that have an average size (e.g., diameter or length) in the range of about 1 to about 100 micrometers, in some embodiments from about 2 to about 80 micrometers, and in some embodiments, from about 5 to about 60 micrometers, such as determined using laser diffraction techniques in accordance with ISO 13320:2009 (e.g., with a Horiba LA-960 particle size distribution analyzer). In certain embodiments, the particulate material may have a "flake" shape in that it has a relatively high aspect ratio (e.g., average length or diameter divided by average thickness), such as about 4:1 or more, in some embodiments about 8:1 or more, and in some embodiments, from about 10:1 to about 2000:1. The average thickness may, for instance, be about 10 micrometers or less, in some embodiments from about 0.01 micrometers to about 8 micrometers, and in some embodiments, from about 0.05 micrometers to about 5 micrometers. In certain embodiments, the thermally conductive particulate material may be in the form of individual platelets having the desired size. Nevertheless, agglomerates of the thermally conductive material having the desired average size noted above may also be suitable. Such agglomerates generally contain individual particles that are aggregated together with no particular orientation or in a highly ordered fashion, for instance via weak chemical bonds such as Van der Waals forces. Examples of suitable hexagonal boron nitride agglomerates, for instance, include those commercially under the designations UHP-2 (Showa Denko) and PT-450 (Momentive Performance Materials). The thermally conductive particulate material may also have a high specific surface area. The specific surface area may be, for example, about 0.5 $m^2$/g or more, in some embodiments about 1 $m^2$/g or more, and in some embodiments, from about 2 to about 40 $m^2$/g. The specific surface area can be determined according to standard methods such as by the physical gas adsorption method (B.E.T. method) with nitrogen as the adsorption gas, as is generally known in the art and described by *Brunauer, Emmet, and Teller* (J. Amer. Chem. Soc., vol. 60, Feb., 1938, pp. 309-319). The particulate material may also have a powder tap density of from about 0.2 to about 1.0 $g/cm^3$, in some embodiments from about 0.3 to about 0.9 $g/cm^3$, and in some embodiments, from about 0.4 to about 0.8 $g/cm^3$, such as determined in accordance with ASTM B527-15.

In addition, an EMI filler may also be distributed within the polymer matrix, typically in an amount from about 1 wt. % to about 20 wt. %, in some embodiments from about 2 wt. % to about 15 wt. %, and in some embodiments, from about 3 wt. % to about 10 wt. % of the composition. The EMI filler is generally formed from an electrically conductive material that can provide the desired degree of electromagnetic interference shielding. In certain embodiments, for instance, the material contains a metal, such as stainless steel, aluminum, zinc, iron, copper, silver, nickel, gold, chrome, etc., as well alloys or mixtures thereof. The EMI filler may also possess a variety of different forms, such as particles (e.g., iron powder), flakes (e.g., aluminum flakes, stainless steel flakes, etc.), or fibers. Particularly suitable EMI fillers are fibers that contain a metal. In such embodiments, the fibers may be formed from primarily from the metal (e.g., stainless steel fibers) or the fibers may be formed from a core material that is coated with the metal. When employing a metal coating, the core material may be formed from a material that is either conductive or insulative in nature. For example, the core material may be formed from carbon, glass, or a polymer. One example of such a fiber is nickel-coated carbon fibers.

In one particular embodiment, the EMI filler may be in the form of "long fibers", which generally refers to fibers, filaments, yarns, or rovings (e.g., bundles of fibers) that are not continuous and have a length of about 7 millimeters or more, in some embodiments from about 8 to about 50 millimeters, in some embodiments from about 9 to about 30 millimeters, and in some embodiments, from about 10 to about 20 millimeters. The fibers may also have an average diameter of about 4 to about 35 micrometers, and in some embodiments, from about 9 to about 35 micrometers. The fibers may be twisted or straight. If desired, the fibers may be in the form of rovings (e.g., bundle of fibers) that contain a single fiber type or different types of fibers. Different fibers may be contained in individual rovings or, alternatively, each roving may contain a different fiber type. The number of fibers contained in each roving can be constant or vary from roving to roving. Typically, a roving may contain from about 1,000 fibers to about 50,000 individual fibers, and in some embodiments, from about 2,000 to about 40,000 fibers.

A wide variety of additional additives can also be included in the polymer composition, such as impact modifiers, compatibilizers, reinforcing fibers (e.g., glass fibers), particulate fillers (e.g., talc, mica, etc.), stabilizers (e.g., light stabilizers, heat stabilizers, etc.), antioxidants, lubricants, pigments (e.g., carbon black), flow modifiers, and other materials added to enhance properties and processability. In one embodiment, for example, one or more impact modifiers are also employed to help improve the impact resistance of the composition. When employed, the impact modifier(s)

typically constitute from about 0.1 wt. % to about 15 wt. %, in some embodiments from about 0.5 wt. % to about 10 wt. %, and in some embodiments, from about 1 wt. % to about 5 wt. % of the polymer composition. Such impact modifier(s) are often present as discontinuous discrete domains within a continuous phase of the polymer matrix. While a variety of impact modifiers may be employed, thermoplastic olefins, and thermoplastic elastomers have been found to be particularly suitable for use in the polymer composition of the present invention. Examples of suitable thermoplastic elastomers may include, for instance, ethylene-propylene copolymers, ethylene-propylene-diene terpolymers (EPDM), methyl methacrylate-butadiene-styrene copolymers (MBS), methyl methacrylate-acrylonitrile-butadiene-styrene copolymers (MABS), methyl methacrylate-butadiene copolymers (MB), methylacrylate-acrylic rubber copolymers (MA), methylacrylate-acrylic rubber-styrene copolymers (MAS), methylmethacrylte-acryl/butadiene rubber copolymers, methylmethacrylte-acryl/butadiene-styrene copolymer, styrene-butadiene-styrene block copolymers (SBS), hydrogenated styrene-butadiene copolymers (SEBS), copolyester elastomers, etc.

Reinforcing fibers may also be employed to help improve the mechanical properties. To help maintain an insulative property, which is often desirable for use in electronic components, the reinforcing fibers may be formed from materials that are also generally insulative in nature, such as glass, ceramics (e.g., alumina or silica), aramids (e.g., Kevlar®), polyolefins, polyesters, etc., as well as mixtures thereof. Glass fibers are particularly suitable, such as E-glass, A-glass, C-glass, D-glass, AR-glass, R-glass, S1-glass, S2-glass, etc., and mixtures thereof. The volume average length of the fibers may be from about 1 to about 400 micrometers, in some embodiments from about 50 to about 400 micrometers, in some embodiments from about 80 to about 250 micrometers, in some embodiments from about 100 to about 200 micrometers, and in some embodiments, from about 110 to about 180 micrometers. The fibers may also have an average diameter of about 10 to about 35 micrometers, and in some embodiments, from about 15 to about 30 micrometers. When employed, the reinforcing fibers typically constitute from about 1 wt. % to about 25 wt. %, in some embodiments from about 2 wt. % to about 20 wt. %, and in some embodiments, from about 5 wt. % to about 15 wt. % of the composition.

Figure 1:
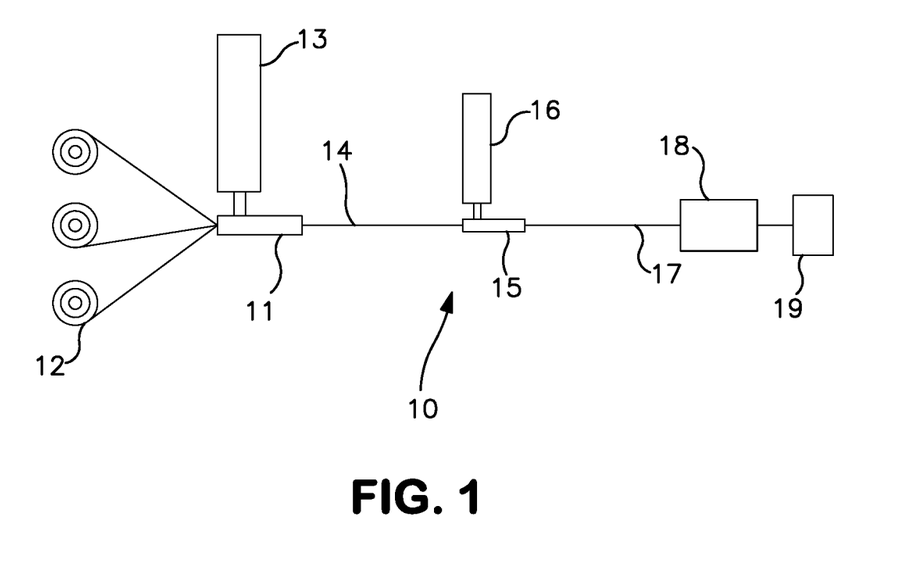
FIG. 1 is a schematic illustration of one embodiment of a system that may be used to form a polymer composition for use in the electronic module of the present invention.

Any of a variety of different techniques may generally be employed to form the polymer composition of the present invention. In certain embodiments, for example, the EMI filler may be in the form of long fibers that are randomly distributed within the polymer matrix, or alternatively distributed in an aligned fashion. In one embodiment, for instance, continuous fibers may initially be impregnated into the polymer matrix to form an extrudate, which is thereafter cooled and then chopped into pellets to that the resulting fibers have the desired length for the long fibers. In such embodiments, the polymer matrix and continuous fibers (e.g., rovings) are typically pultruded through an impregnation die to achieve the desired contact between the fibers and the polymer. Pultrusion can also help ensure that the fibers are spaced apart and oriented in a longitudinal direction that is parallel to a major axis of the pellet (e.g., length), which further enhances the mechanical properties. Referring to FIG. 1, for instance, one embodiment of a pultrusion process 10 is shown in which a polymer matrix is supplied from an extruder 13 to an impregnation die 11 while continuous fibers 12 are a pulled through the die 11 via a puller device 18 to produce a composite structure 14. Typical puller devices may include, for example, caterpillar pullers and reciprocating pullers. While optional, the composite structure 14 may also be pulled through a coating die 15 that is attached to an extruder 16 through which a coating resin is applied to form a coated structure 17. As shown in FIG. 1, the coated structure 17 is then pulled through the puller assembly 18 and supplied to a pelletizer 19 that cuts the structure 17 into the desired size for forming the long polymer composition.

The nature of the impregnation die employed during the pultrusion process may be selectively varied to help achieved good contact between the polymer matrix and the long fibers. Examples of suitable impregnation die systems are described in detail in Reissue Patent No. 32,772 to *Hawley*; 9,233,486 to *Regan, et al.*; and 9,278,472 to *Eastep, et al.* Referring to FIG. 2, for instance, one embodiment of such a suitable impregnation die 11 is shown. As shown, a polymer matrix 127 may be supplied to the impregnation die 11 via an extruder (not shown). More particularly, the polymer matrix 127 may exit the extruder through a barrel flange 128 and enter a die flange 132 of the die 11. The die 11 contains an upper die half 134 that mates with a lower die half 136. Continuous fibers 142 (e.g., roving) are supplied from a reel 144 through feed port 138 to the upper die half 134 of the die 11. Similarly, continuous fibers 146 are also supplied from a reel 148 through a feed port 140. The matrix 127 is heated inside die halves 134 and 136 by heaters 133 mounted in the upper die half 134 and/or lower die half 136. The die is generally operated at temperatures that are sufficient to cause melting and impregnation of the polymer. Typically, the operation temperatures of the die is higher than the melt temperature of the polymer matrix. When processed in this manner, the continuous fibers 142 and 146 become embedded in the matrix 127. The mixture is then pulled through the impregnation die 11 to create a polymer composition 152. If desired, a pressure sensor 137 may also sense the pressure near the impregnation die 11 to allow control to be exerted over the rate of extrusion by controlling the rotational speed of the screw shaft, or the federate of the feeder.

Figure 2:
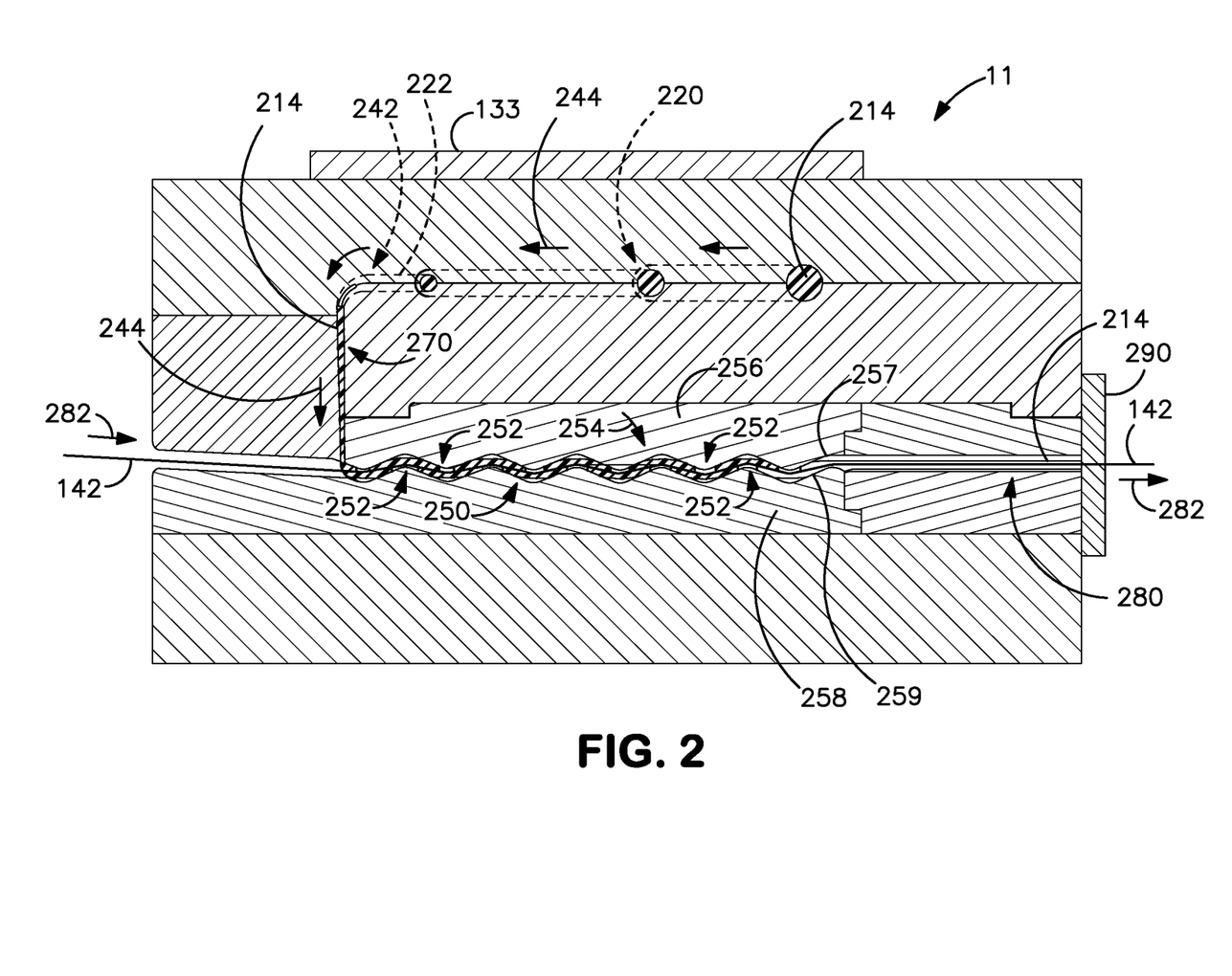
FIG. 2 is a cross-sectional view of an impregnation die that may be employed in the system shown in FIG. 1.

Within the impregnation die, it is generally desired that the fibers contact a series of impingement zones. At these zones, the polymer melt may flow transversely through the fibers to create shear and pressure, which significantly enhances the degree of impregnation. This is particularly useful when forming a composite from ribbons of a high fiber content. Typically, the die will contain at least 2, in some embodiments at least 3, and in some embodiments, from 4 to 50 impingement zones per roving to create a sufficient degree of shear and pressure. Although their particular form may vary, the impingement zones typically possess a curved surface, such as a curved lobe, rod, etc. The impingement zones are also typically made of a metal material.

FIG. 2 shows an enlarged schematic view of a portion of the impregnation die 11 containing multiple impingement zones in the form of lobes 182. It should be understood that this invention can be practiced using a plurality of feed ports, which may optionally be coaxial with the machine direction. The number of feed ports used may vary with the number of fibers to be treated in the die at one time and the feed ports may be mounted in the upper die half 134 or the lower die half 136. The feed port 138 includes a sleeve 170 mounted in upper die half 134. The feed port 138 is slidably mounted in a sleeve 170. The feed port 138 is split into at least two pieces, shown as pieces 172 and 174. The feed port 138 has a bore 176 passing longitudinally therethrough. The bore 176 may be shaped as a right cylindrical cone opening away from the upper die half 134. The fibers 142 pass through the bore 176 and enter a passage 180 between the upper die half 134 and lower die half 136. A series of lobes 182 are also formed in the upper die half 134 and lower die half 136 such that the passage 210 takes a convoluted route. The lobes 182 cause the fibers 142 and 146 to pass over at least one lobe so that the polymer matrix inside the passage 180 thoroughly contacts each of the fibers. In this manner, thorough contact between the molten polymer and the fibers 142 and 146 is assured.

To further facilitate impregnation, the fibers may also be kept under tension while present within the impregnation die. The tension may, for example, range from about 5 to about 300 Newtons, in some embodiments from about 50 to about 250 Newtons, and in some embodiments, from about 100 to about 200 Newtons per tow of fibers. Furthermore, the fibers may also pass impingement zones in a tortuous path to enhance shear. For example, in the embodiment shown in FIG. 2, the fibers traverse over the impingement zones in a sinusoidal-type pathway. The angle at which the rovings traverse from one impingement zone to another is generally high enough to enhance shear, but not so high to cause excessive forces that will break the fibers. Thus, for example, the angle may range from about 1° to about 30°, and in some embodiments, from about 5° to about 25°.

The impregnation die shown and described above is but one of various possible configurations that may be employed in the present invention. In alternative embodiments, for example, the fibers may be introduced into a crosshead die that is positioned at an angle relative to the direction of flow of the polymer melt. As the fibers move through the crosshead die and reach the point where the polymer exits from an extruder barrel, the polymer is forced into contact with the fibers. It should also be understood that any other extruder design may also be employed, such as a twin screw extruder. Still further, other components may also be optionally employed to assist in the impregnation of the fibers. For example, a "gas jet" assembly may be employed in certain embodiments to help uniformly spread a bundle or tow of individual fibers, which may each contain up to as many as 24,000 fibers, across the entire width of the merged tow. This helps achieve uniform distribution of strength properties in the ribbon. Such an assembly may include a supply of compressed air or another gas that impinges in a generally perpendicular fashion on the moving fiber tows that pass across the exit ports. The spread fiber bundles may then be introduced into a die for impregnation, such as described above.

Other ingredients, such as the thermally conductive fillers, impact modifiers, reinforcing fibers, stabilizers, antioxidants, lubricants, etc., may also be incorporated into the composition in combination with the long fibers. In the embodiment shown in FIG. 2, for instance, such components may be previously combined with the polymer to form the polymer matrix 127. Alternatively, additional components may also be incorporated into the polymer matrix during fiber impregnation. Notwithstanding these options, the present inventors have nevertheless discovered that a particularly effective technique for incorporating additional components into the polymer matrix involves the use of polymer masterbatches, which are then later combined to form the final composition to allow for better enhanced blending of the components. For example, a first masterbatch (e.g., pellet, strand, etc.) may be formed that a high percentage of long fibers. For example, long fibers may constitute from about 20 wt. % to about 70 wt. %, and in some embodiments, from about 40 wt. % to about 60 wt. % of the first masterbatch, and polymer(s) may constitute from about 20 wt. % to about 70 wt. %, and in some embodiments, from about 40 wt. % to about 60 wt. % of the first masterbatch. A second masterbatch (e.g., pellet, strand, etc.) may also be employed that is generally free of long fibers and that contains substantially all of the thermally conductive filler employed in the composition. For example, long fibers may constitute no more than about 10 wt. %, and in some embodiments, from 0 wt. % to about 5 wt. % of the second masterbatch. Likewise, the thermally conductive filler may constitute from about 10 wt. % to about 40 wt. %, and in some embodiments, from about 20 wt. % to about 30 wt. % of the second masterbatch, and polymer(s) may constitute from about 20 wt. % to about 70 wt. %, and in some embodiments, from about 40 wt. % to about 60 wt. % of the first masterbatch. If desired, substantially all of other additional components may also be contained within the second masterbatch, such as impact modifiers, compatibilizers, reinforcing fibers (e.g., glass fibers), particulate fillers (e.g., talc, mica, etc.), stabilizers (e.g., light stabilizers, heat stabilizers, etc.), antioxidants, lubricants, pigments (e.g., carbon black), flow modifiers, etc.

Once formed, the first masterbatch may then be combined with the second masterbatch. For example, the masterbatches may be supplied separately or in combination to an extruder that includes at least one screw rotatably mounted and received within a barrel (e.g., cylindrical barrel) and may define a feed section and a melting section located downstream from the feed section along the length of the screw. One or more of the sections of the extruder are typically heated, such as within a temperature range of from about 200° C. to about 450° C., in some embodiments, from about 210° C. to about 350° C., and in some embodiments, from about 220° C. to about 350° C. to form the composition. The speed of the screw may be selected to achieve the desired residence time, shear rate, melt processing temperature, etc. For example, the screw speed may range from about 50 to about 800 revolutions per minute ("rpm"), in some embodiments from about 70 to about 150 rpm, and in some embodiments, from about 80 to about 120 rpm. The apparent shear rate during melt blending may also range from about 100 seconds$^{-1}$ to about 10,000 seconds$^{-1}$, in some embodiments from about 500 seconds$^{-1}$ to about 5000 seconds$^{-1}$, and in some embodiments, from about 800 seconds$^{-1}$ to about 1200 seconds$^{-1}$. The apparent shear rate is equal to $4Q/\pi R^3$, where Q is the volumetric flow rate ("m$^3$/s") of the polymer melt and R is the radius ("m") of the capillary (e.g., extruder die) through which the melted polymer flows.

As discussed above, the present inventors have discovered that through selective control over the particular type and concentration of the polymer matrix, EMI filler, and thermally conductive filler, as well as the manner in which they are combined to form the composition, the resulting composition may exhibit the desired combination of thermal conductivity and electromagnetic shielding. While having all of the benefits noted above, the present inventors have also discovered that the specific gravity of the composition may remain relatively low, which can reduce the weight and cost of parts formed therefrom. For example, the specific gravity may be about 2 g/cm$^3$ or less, in some embodiments about 1.8 g/cm$^3$ or less, and in some embodiments, from about 1.2 to about 1.6 g/cm$^3$, as determined in accordance with ISO 1183-1:2012.

Conventionally, it was believed that compositions with a low density and good EMI/thermal properties could not also possess sufficiently good mechanical properties. Contrary to conventional thought, however, the present inventors have discovered that through careful control over the particular materials employed (e.g., nature of the EMI filler, propylene polymer, chain-scission agent, etc.) and the manner in which they are processed (e.g., impregnation techniques, pultrusion techniques, etc.), parts can be formed from the polymer composition that still possess excellent mechanical properties. For example, the composition may exhibit a Charpy unnotched impact strength greater than about 5 kJ/m$^2$, in some embodiments from about 6 to about 50 kJ/m$^2$, and in some embodiments, from about 8 to about 20 kJ/m$^2$, measured at 23° C. according to ISO Test No. 179-1:2010 (technically equivalent to ASTM D256-10e1). The composition may also exhibit a Charpy notched impact strength greater than about 0.5 kJ/m$^2$, in some embodiments from about 1 to about 20 kJ/m$^2$, and in some embodiments, from about 2 to about 10 kJ/m$^2$, measured at 23° C. according to ISO Test No. 179-1:2010 (technically equivalent to ASTM D256-10e1).

The tensile and flexural mechanical properties may also be good. For example, the composition may exhibit a tensile strength of from about 20 to about 300 MPa, in some embodiments from about 30 to about 200 MPa, and in some embodiments, from about 40 to about 150 MPa; a tensile break strain of about 0.5% or more, in some embodiments from about 0.6% to about 5%, and in some embodiments, from about 0.7% to about 2.5%; and/or a tensile modulus of from about 3,500 MPa to about 20,000 MPa, in some embodiments from about 4,000 MPa to about 15,000 MPa, and in some embodiments, from about 5,000 MPa to about 10,000 MPa. The tensile properties may be determined in accordance with ISO Test No. 527-1:2012 (technically equivalent to ASTM D638-14) at 23° C. The polymer composition may also exhibit a flexural strength of from about 50 to about 500 MPa, in some embodiments from about 80 to about 400 MPa, and in some embodiments, from about 100 to about 250 MPa; a flexural break strain of about 0.5% or more, in some embodiments from about 0.6% to about 5%, and in some embodiments, from about 0.7% to about 2.5%; and/or a flexural modulus of from about 2,000 MPa to about 20,000 MPa, in some embodiments from about 3,000 MPa to about 15,000 MPa, and in some embodiments, from about 4,000 MPa to about 10,000 MPa. The flexural properties may be determined in accordance with ISO Test No. 178:2010 (technically equivalent to ASTM D790-15e2) at 23° C. The polymer composition may also exhibit a deflection temperature under load (DTUL) of about 160° C. or more, and in some embodiments, from about 180° C. to about 220° C., as determined in accordance with ISO 75-2:2013 (technically equivalent to ASTM D648-07) at a specified load of 1.8 MPa.

To incorporate the polymer composition into the electronic module, it is generally desired to that the composition is formed into a shaped part. Such shaped parts may have a wide variety of thicknesses, such as about 10 millimeters or less, in some embodiments about 5 millimeters or less, and in some embodiments, from about 1 to about 4 millimeters (e.g., 3 millimeters). The shaped part may be formed using a variety of different techniques. Suitable techniques may include, for instance, injection molding, low-pressure injection molding, extrusion compression molding, gas injection molding, foam injection molding, low-pressure gas injection molding, low-pressure foam injection molding, gas extrusion compression molding, foam extrusion compression molding, extrusion molding, foam extrusion molding, compression molding, foam compression molding, gas compression molding, etc. For example, an injection molding system may be employed that includes a mold within which the polymer composition may be injected. The time inside the injector may be controlled and optimized so that polymer matrix is not pre-solidified. When the cycle time is reached and the barrel is full for discharge, a piston may be used to inject the composition to the mold cavity. Compression molding systems may also be employed. As with injection molding, the shaping of the polymer composition into the desired article also occurs within a mold. The composition may be placed into the compression mold using any known technique, such as by being picked up by an automated robot arm. The temperature of the mold may be maintained at or above the solidification temperature of the polymer matrix for a desired time period to allow for solidification. The molded product may then be solidified by bringing it to a temperature below that of the melting temperature. The resulting product may be de-molded. The cycle time for each molding process may be adjusted to suit the polymer matrix, to achieve sufficient bonding, and to enhance overall process productivity.

The present invention may be better understood with reference to the following examples.

Test Methods

Thermal Conductivity: In-plane and through-plane thermal conductivity values are determined in accordance with ASTM E1461-13.

Electromagnetic Interference ("EMI") Shielding: EMI shielding effectiveness may be determined in accordance with ASTM D4935-10 at frequency ranges ranging from 30 MHz to 1.5 GHz (e.g., 1 GHz). The test may be performed using an EM-2107A standard test fixture, which is an enlarged section of coaxial transmission line and available from various manufacturers, such as Electro-Metrics. The measured data relates to the shielding effectiveness due to a plane wave (far field EM wave) from which near field values for magnetic and electric fields may be inferred.

Surface/Volume Resistivity: The surface and volume resistivity values are generally determined in accordance with ISO 3915:1981 and/or ISO 1853:2011. For example, a standard specimen (e.g., 1 meter cube) may be placed between two electrodes. A voltage may be applied for sixty (60) seconds and the resistance may be measured. The surface resistivity is the quotient of the potential gradient (in V/m) and the current per unit of electrode length (in A/m), and generally represents the resistance to leakage current along the surface of an insulating material. Because the four (4) ends of the electrodes define a square, the lengths in the quotient cancel and surface resistivities are reported in ohms, although it is also common to see the more descriptive unit of ohms per square. Volume resistivity may also be determined as the ratio of the potential gradient parallel to the current in a material to the current density. In SI units, volume resistivity is numerically equal to the direct-current resistance between opposite faces of a one-meter cube of the material (ohm-m).

Specific Gravity: Specific gravity may be determined in accordance with ISO 1183-1:2012.

Melt Viscosity: The melt viscosity (Pa-s) may be determined in accordance with ISO Test No. 11443:2005 at a shear rate of 1000 s$^{-1}$ and temperature 15° C. above the melting temperature (e.g., 350° C.) using a Dynisco LCR7001 capillary rheometer. The rheometer orifice (die) had a diameter of 1 mm, length of 20 mm, L/D ratio of 20.1, and an entrance angle of 180°. The diameter of the barrel was 9.55 mm+0.005 mm and the length of the rod was 233.4 mm.

Melting Temperature: The melting temperature ("Tm") may be determined by differential scanning calorimetry ("DSC") as is known in the art. The melting temperature is the differential scanning calorimetry (DSC) peak melt temperature as determined by ISO Test No. 11357-2:2013. Under the DSC procedure, samples were heated and cooled at 20° C. per minute as stated in ISO Standard 10350 using DSC measurements conducted on a TA Q2000 Instrument.

Tensile Modulus, Tensile Stress, and Tensile Elongation at Break: Tensile properties may be tested according to ISO Test No. 527-1:2012 (technically equivalent to ASTM D638-14). Modulus and strength measurements may be made on the same test strip sample having a length of 80 mm, thickness of 10 mm, and width of 4 mm. The testing temperature may be 23° C. or 150° C., and the testing speeds may be 1 or 5 mm/min.

Flexural Modulus, Flexural Elongation at Break, and Flexural Stress: Flexural properties may be tested according to ISO Test No. 178:2010 (technically equivalent to ASTM D790-15e2). This test may be performed on a 64 mm support span. Tests may be run on the center portions of uncut ISO 3167 multi-purpose bars. The testing temperature may be 23° C. or 150° C. and the testing speed may be 2 mm/min.

Unotched and Notched Charpy Impact Strength: Charpy properties may be tested according to ISO Test No. ISO 179-1:2010) (technically equivalent to ASTM D256-10, Method B). This test may be run using a Type 1 specimen size (length of 80 mm, width of 10 mm, and thickness of 4 mm). When testing the notched impact strength, the notch may be a Type A notch (0.25 mm base radius). Specimens may be cut from the center of a multi-purpose bar using a single tooth milling machine. The testing temperature may be 23° C. or −30° C.

Deflection Temperature Under Load ("DTUL"): The deflection under load temperature may be determined in accordance with ISO Test No. 75-2:2013 (technically equivalent to ASTM D648-07). More particularly, a test strip sample having a length of 80 mm, thickness of 10 mm, and width of 4 mm may be subjected to an edgewise three-point bending test in which the specified load (maximum outer fibers stress) was 1.8 Megapascals. The specimen may be lowered into a silicone oil bath where the temperature is raised at 2° C. per minute until it deflects 0.25 mm (0.32 mm for ISO Test No. 75-2:2013).

EXAMPLE 1

A sample is formed that contains approximately 53 wt. % of a polybutylene terephthalate (PBT) blend of a high and low viscosity base polymer, approximately 1 wt. % of stabilizers, approximately 5% impact modifiers, 10 wt. % chopped fiberglass, 6 wt. % steel fibers, and 25 wt. % graphite flake. All components except the steel fiber and 6% of the PBT are melt-processed in a twin screw extruder (25 mm) at approximately 270° C. and formed into a short 3-mm pellet. The steel fiber and 6% of the PBT are produced into a longer 11 mm pellet form using a pultrusion process. The 2 pellets are tumbled together to form a dry blend that is then fed into an injection molding process to produce a part.

EXAMPLE 2

A sample is formed as described in Example 1 but with only a low viscosity PBT at 43% and at a graphite flake level of 35 wt. %.

The parts of Examples 1-2 (thickness of 3.2 mm) were tested for various properties as described herein. The results are set forth in Table 1 below.

TABLE 1

Properties for Parts Having a Thickness of 3.2 mm

| | Units | Method | Example 1 | Example 2 |
|---|---|---|---|---|
| Density | g/cc | ISO 1183 | 1.56 | 1.65 |
| Tensile modulus (1 mm/min) 23° C. | GPa | ISO 527-1 | 9 | 11 |
| Tensile strength 23° C. | MPa | ISO 527-1 | 54 | 44 |
| Tensile strain @ break (5 mm/min) 23° C. | % | ISO 527-1 | 1.0 | 0.5 |
| Flexural modulus 23° C. | GPa | ISO 178 | 11 | 13 |
| Flexural strength 23° C. | MPa | ISO 178 | 90 | 80 |
| Flexural strain @ break 23° C. | % | ISO 178 | 1.3 | 0.9 |
| Unnotched Charpy impact strength 23° C. | kJ/m$^2$ | ISO 179 | 10 | 6 |
| Notched Charpy impact strength 23° C. | kJ/m$^2$ | ISO 179 | 3 | 3 |
| DTUL @ 1.8 MPa | ° C. | ISO 75 | 205 | 207 |
| Thermal Conductivity Flow Direction | W/(m*K) | ASTM E1461 | 9 | 16 |
| Thermal Conductivity Cross Flow Direction | W/(m*K) | ASTM E1461 | 7 | 11 |
| Thermal Conductivity Through Plan Direction | W/(m*K) | ASTM E1461 | 1.7 | 2.5 |
| EMI shielding @ 200 MHz | dB | ASTM D4935/EM2107A | 58 | 49 |
| EMI shielding @ 600 MHz | dB | ASTM D4935/EM2107A | 55 | 53 |
| EMI shielding @ 1.0 GHzHz | dB | ASTM D4935/EM2107A | 57 | 54 |
| EMI shielding @ 1.5 GHz | dB | ASTM D4935/EM2107A | 63 | 57 |
| Volume Resistivity | Ohms-cm | ISO 3915/1853 | 1 | 1 |

What is claimed is:

1. An electronic module comprising:
   a housing;
   a radome that is disposed over the housing to define an interior; and
   one or more electronic components positioned within the interior;
   wherein at least a portion of the housing, radome, or both contain a polymer composition that exhibits an in-plane thermal conductivity of 1 W/m-K or more as determined in accordance with ASTM E 1461-13 and an electromagnetic shielding effectiveness of 20 dB or more as determined at a frequency of 1 GHz in accordance with EM 2107A, wherein the polymer composition contains a thermally conductive filler and an EMI filler that are distributed within a polymer matrix, and wherein the EMI filler constitutes from 1 wt. % to 10 wt. % of the composition.

2. The electronic module of claim 1 wherein a printed circuit board is disposed within the interior.

3. The electronic module of claim 1, wherein the housing includes a base that contains a sidewall extending therefrom, and further wherein the radome is supported on the sidewall.

4. The electronic module of claim 1, wherein the electronic components include a radio frequency sensing component.

5. The electronic module of claim 4, wherein the module is a radar module.

6. The electronic module of claim 1, wherein the electronic components include a fiber optic assembly for receiving and transmitting light pulses.

7. The electronic module of claim 6, wherein the electronic module is a lidar module.

8. The electronic module of claim 1, wherein the module is free of a metal EMI shield.

9. The electronic module of claim 1, wherein the module is free of a heat sink.

10. The electronic module of claim 1, wherein the housing includes the polymer composition.

11. The electronic module of claim 1, wherein the radome includes the polymer composition.

12. The electronic module of claim 1, wherein the polymer matrix constitutes from 30 wt. % to 80 wt. % of the composition.

13. The electronic module of claim 1, wherein the polymer matrix contains an aromatic polymer having a melting temperature of 200° C. or more.

14. The electronic module of claim 13, wherein the aromatic polymer is an aromatic polyester.

15. The electronic module of claim 14, wherein the aromatic polyester is poly(1,4-butylene terephthalate).

16. The electronic module of claim 1, wherein the EMI filler contains an electrically conductive material and is in the form of particles, flakes, or fibers.

17. The electronic module of claim 16, wherein the EMI filler contains a plurality of long fibers having a length of 7 millimeters or more.

18. The electronic module of claim 16, wherein the electrically conductive material includes stainless steel, aluminum, zinc, copper, silver, nickel, gold, chrome, iron, or an alloy or mixture thereof.

19. The electronic module of claim 1, wherein thermally conductive fillers constitute from 5 wt. % to 40 wt. % of the composition.

20. The electronic module of claim 1, wherein the thermally conductive filler has an intrinsic thermal conductivity of 50 W/m-K or more.

21. The electronic module of claim 1, wherein the thermally conductive filler includes graphite.

22. The electronic module of claim 1, wherein the thermally conductive filler includes a particulate material.

23. The electronic module of claim 1, wherein the polymer composition further includes an impact modifier, compatibilizer, reinforcing fibers, particulate filler, stabilizer, antioxidant, lubricant, pigment, flow modifier, or a combination thereof.

24. An automotive vehicle comprising the electronic module of claim 1.

25. The electronic module of claim 1, wherein the polymer composition exhibits an in-plane thermal conductivity of 5 W/m-K or more as determined in accordance with ASTM E 1461-13.

26. The electronic module of claim 1, wherein the polymer composition exhibits a through-plane thermal conductivity of from 1 W/m-K to 5 W/m-K as determined in accordance with ASTM E 1461-13.

* * * * *